(12) United States Patent
　　Barsukou

(10) Patent No.:　US 12,696,688 B2
(45) Date of Patent:　Jul. 28, 2026

(54) PISTON MODE GENERATION IN THIN PLATE LAMB WAVE DEVICE

(71) Applicant: SKYWORKS SOLUTIONS, INC., Irvine, CA (US)

(72) Inventor: Siarhei Dmitrievich Barsukou, Takarazuka (JP)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 1171 days.

(21) Appl. No.: 17/585,772

(22) Filed: Jan. 27, 2022

(65) Prior Publication Data

US 2022/0246824 A1　　Aug. 4, 2022

Related U.S. Application Data

(60) Provisional application No. 63/143,216, filed on Jan. 29, 2021.

(51) Int. Cl.
| | | |
|---|---|---|
| *H03H 9/25* | (2006.01) | |
| *H03H 3/04* | (2006.01) | |
| *H10N 30/05* | (2023.01) | |
| *H10N 30/87* | (2023.01) | |

(52) U.S. Cl.
CPC ............ *H10N 30/872* (2023.02); *H03H 3/04* (2013.01); *H03H 9/25* (2013.01); *H10N 30/05* (2023.02); *H03H 2003/0435* (2013.01)

(58) Field of Classification Search
CPC ............................... H10N 30/872; H03H 9/25
USPC ...... 310/313 R, 313 A, 313 B, 313 C, 313 D
See application file for complete search history.

(56) References Cited

U.S. PATENT DOCUMENTS

| | | | | |
|---|---|---|---|---|
| 5,432,393 A | * | 7/1995 | Davenport | ......... H03H 9/02228 |
| | | | | 333/193 |
| 5,514,626 A | * | 5/1996 | Hickernell | ......... H03H 9/02976 |
| | | | | 438/571 |
| 2010/0182102 A1 | * | 7/2010 | Kuypers | ............ H03H 9/02834 |
| | | | | 333/197 |
| 2016/0352304 A1 | * | 12/2016 | Kadota | .............. H03H 9/02559 |

OTHER PUBLICATIONS

Chen et al., "High-Q X Band Aluminum Nitride Combined Overtone Resonators", Northeastern Smart Center, Northeastern University, Boston, Massachusetts, USA, 2019 IEEE.

Gao et al., "A 3.5 Ghz AlN S1 Lamb Mode Resonator", 2017 IEEE, Conference Paper, Sep. 2017.

Qamar et al., "Solidly Mounted Anti-Symmetric Lamb-Wave Delay Lines as an Alternate to SAW Devices", IEEE Electron Device Letters, vol. 39, No. 12, Dec. 2018, pp. 1916-1919.

Zou et al., "Transducer design for AlN Lamb wave resonators," Journal of Applied Physics 121, 154502 (2017). [http:/dx.doi.org/ 10.1063/1.4979914].

\* cited by examiner

*Primary Examiner* — Derek J Rosenau
(74) *Attorney, Agent, or Firm* — Lando & Anastasi, LLP

(57)　　　　ABSTRACT

An acoustic wave resonator comprises a plurality of interdigital transducer (IDT) electrodes disposed on upper and lower sides of a piezoelectric film, the IDT electrodes on the upper side of the piezoelectric film being offset from the IDT electrodes on the lower side of the piezoelectric film by $\lambda/4$, $\lambda$ being a wavelength of a main acoustic wave generated by the acoustic wave resonator to enable the acoustic wave resonator to generate piston mode acoustic waves responsive to electrical excitation of the plurality of IDT electrodes with an alternating current.

10 Claims, 11 Drawing Sheets

Fs: 6915MHz                Fp: 6920MHz

K2: 0.2%

Fs: 5530MHz                    Fp: 5535MHz

K2: 0.2%

PISTON MODE GENERATION IN THIN PLATE LAMB WAVE DEVICE

CROSS-REFERENCE TO RELATED APPLICATIONS

This application claims priority under 35 U.S.C. § 119(e) to U.S. Provisional Patent Application Ser. No. 63/143,216, titled "PISTON MODE GENERATION IN THIN PLATE LAMB WAVE DEVICE," filed Jan. 29, 2021, the entire contents of which being incorporated herein by reference for all purposes.

BACKGROUND

Technical Field

Embodiments of this disclosure relate to acoustic wave resonators and structures and devices including same.

Description of Related Technology

Acoustic wave devices, for example, surface acoustic wave (SAW) and bulk acoustic wave (BAW) devices may be utilized as components of filters in radio frequency electronic systems. For instance, filters in a radio frequency front-end of a mobile phone can include acoustic wave filters. Two acoustic wave filters can be arranged as a duplexer.

SUMMARY

In accordance with one aspect, there is provided an acoustic wave resonator comprising a plurality of interdigital transducer (IDT) electrodes disposed on upper and lower sides of a piezoelectric film, the IDT electrodes on the upper side of the piezoelectric film being offset from the IDT electrodes on the lower side of the piezoelectric film by $\lambda/4$, $\lambda$ being a wavelength of a main acoustic wave generated by the acoustic wave resonator to enable the acoustic wave resonator to generate piston mode acoustic waves responsive to electrical excitation of the plurality of IDT electrodes with an alternating current.

In some embodiments, the piezoelectric film includes aluminum nitride.

In some embodiments, the piezoelectric film has a thickness of between $0.1\lambda$ and $1.0\lambda$.

In some embodiments, the piezoelectric film has a thickness of between $0.3\lambda$, and $0.5\lambda$.

In some embodiments, the plurality of IDT electrodes each have a thickness of between about $0.01\lambda$ and about $0.03\lambda$.

In some embodiments, the acoustic wave resonator is included in an electrical module having a frequency generator and phase shifter that causes a phase of an excitation voltage applied to the IDT electrodes on the upper side of the piezoelectric film to be phase shifted from an excitation voltage applied to the IDT electrodes on the lower side of the piezoelectric film.

In some embodiments, the acoustic wave resonator is included in an electrical module having a frequency generator and phase shifter that causes a phase of an excitation voltage applied to the IDT electrodes on the upper side of the piezoelectric film to be phase shifted by 90° from an excitation voltage applied to the IDT electrodes on the lower side of the piezoelectric film.

In some embodiments, the acoustic wave resonator has a resonant frequency above 5 GHz.

In some embodiments, the acoustic wave resonator has a resonant frequency above 6.5 GHz.

In some embodiments, the acoustic wave resonator has a resonant frequency above one of 9 GHz or 9.2 GHz.

In accordance with another aspect, there is provided a method of generating piston mode acoustic waves in an acoustic wave resonator including a plurality of interdigital transducer (IDT) electrodes disposed on upper and lower sides of a piezoelectric film, the IDT electrodes on the upper side of the piezoelectric film being offset from the IDT electrodes on the lower side of the piezoelectric film by $\lambda/4$, $\lambda$ being a wavelength of a main acoustic wave generated by the acoustic wave resonator. The method comprises applying an excitation voltage to the IDT electrodes on the upper side of the piezoelectric film that is phase shifted from an excitation voltage applied to the IDT electrodes on the lower side of the piezoelectric film.

In some embodiments, the method comprises applying an excitation voltage to the IDT electrodes on the upper side of the piezoelectric film that is phase shifted by 90° from an excitation voltage applied to the IDT electrodes on the lower side of the piezoelectric film.

In some embodiments, the method comprises generating piston mode acoustic waves in the acoustic wave resonator having a frequency above 5 GHz.

In some embodiments, the method comprises generating piston mode acoustic waves in the acoustic wave resonator having a frequency above 6.5 GHz.

In some embodiments, the method comprises generating piston mode acoustic waves in the acoustic wave resonator having a frequency above one of 9 GHz or over 9.2 GHz.

BRIEF DESCRIPTION OF THE DRAWINGS

Embodiments of this disclosure will now be described, by way of non-limiting example, with reference to the accompanying drawings.

DETAILED DESCRIPTION OF CERTAIN EMBODIMENTS

Figure 1:
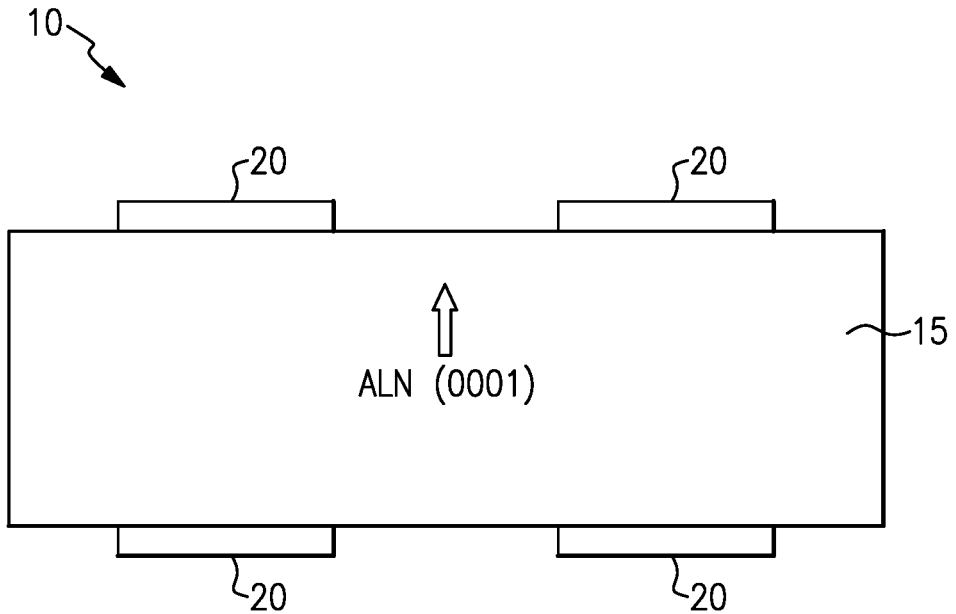
FIG. 1 is a simplified cross-sectional view of a portion of an example of a Lamb wave acoustic wave resonator.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Acoustic wave elements or resonators may be classified as surface acoustic wave (SAW) elements or bulk acoustic wave (BAW) elements, depending upon whether a main acoustic wave generated by excitement of the acoustic wave element travels along a surface or through the bulk of the substrate of the element.

A Lamb wave resonator can combine features of a SAW resonator and a BAW resonator. A Lamb wave resonator typically includes an interdigital transducer (IDT) electrode similar to a SAW resonator. Accordingly, the frequency of the Lamb wave resonator can be lithographically defined. A Lamb wave resonator can achieve a relatively high quality factor (Q) and a relatively high phase velocity like a BAW resonator (e.g., due to a suspended structure). A Lamb wave resonator that includes an AlN piezoelectric layer can be relatively easy to integrate with other circuits, for example, because AlN process technology can be compatible with complementary metal oxide semiconductor (CMOS) process technology. AlN Lamb wave resonators can overcome a relatively low resonance frequency limitation and integration challenge associated with SAW resonators and also overcome multiple frequency capability challenges associated with BAW resonators.

One example of a Lamb wave resonator is illustrated in partial cross-sectional view in FIG. 1, indicated generally at 10. As illustrated, the Lamb wave resonator 10 includes a piezoelectric layer 15 and interdigital transducer (IDT) electrodes 20 disposed on the upper and lower surfaces of the piezoelectric layer 15. The piezoelectric layer 15 can be a thin film. The piezoelectric layer 15 can be an aluminum nitride layer. In other instances, the piezoelectric layer 15 can be any suitable piezoelectric layer. The frequency of acoustic waves generated in the Lamb wave resonator can be based on the geometry and spacing between the IDT electrodes 20. Some of the IDT electrodes 20 can be grounded in certain instances. In some other instances, some of the IDT electrodes 20 can be floating. An air cavity (or vacuum cavity or a cavity filled with some other gas) is typically provided between the lower surface of the piezoelectric layer 15 and a substrate upon which the Lamb wave resonator is mounted to allow for acoustic waves to pass through the piezoelectric layer 15.

Figure 2:
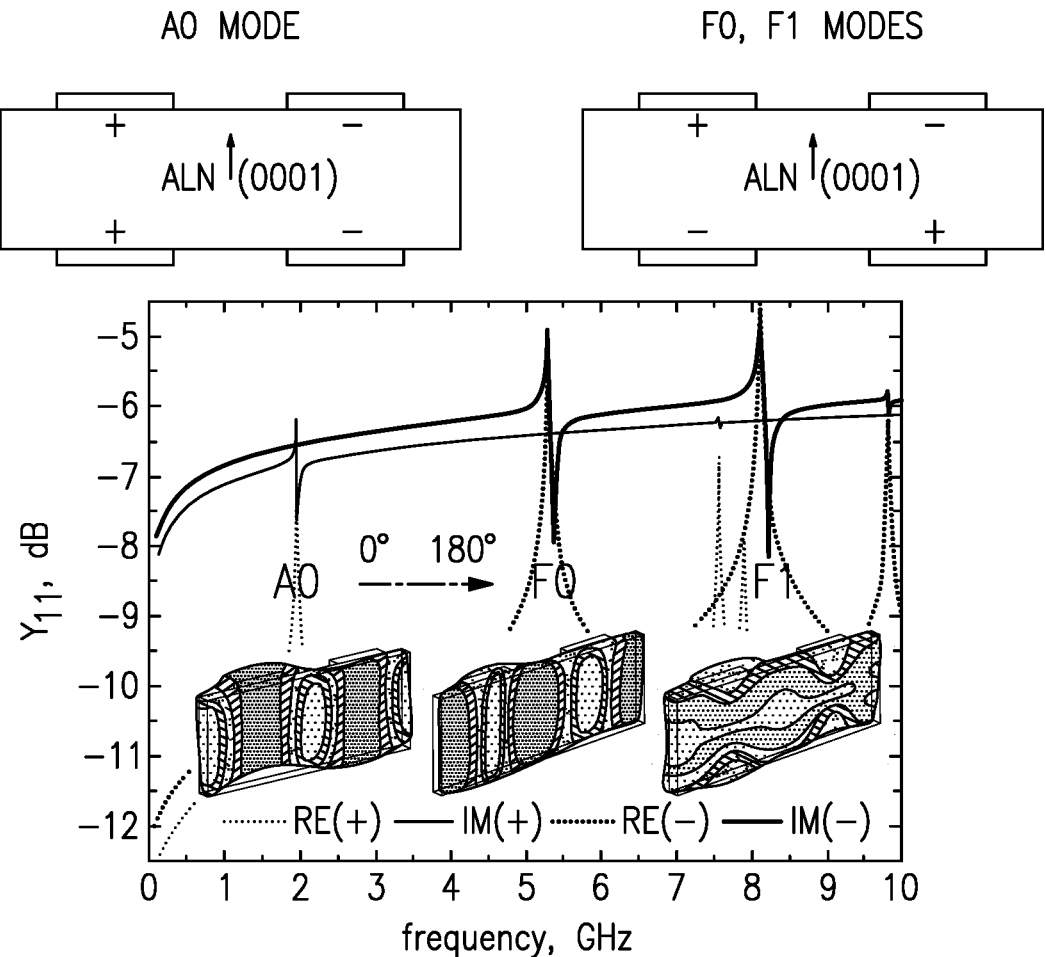
FIG. 2 illustrates frequencies at which various excitation modes occur in the Lamb wave acoustic wave resonator of FIG. 1.

Depending upon the voltages applied to the IDT electrodes 20, the Lamb wave resonator may exhibit A0 (main mode), F0 (second harmonic), and/or F1 (second harmonic) acoustic wave excitation modes. FIG. 2 illustrates the polarities that may be applied to the different IDT electrodes 20 to generate the A0, F0, and F1 acoustic wave excitation modes as well as a chart exhibiting the frequencies at which these modes are observed for an example device having an IDT electrode spacing $\lambda/2$ of 1 µm, an AlN layer thickness ($H_s$) of $0.3\lambda$, and an IDT electrode 20 thickness ($H_e$, height) of $0.03\lambda$, with $\lambda$ being the wavelength of the main acoustic wave generated in the resonator. FIG. 2 also illustrates the associated impedance parameter Y11 for the different excitation modes where the curves RE(+), IM(+), RE(−), and IM(−) represent the real and imaginary parts of the $Y_{11}$ curves with the different polarities applied to the IDT electrodes as shown in the upper part of the figure; the RE(+) and IM(+) curves generated from the polarities as illustrated with the same polarities applied to vertically corresponding IDT electrodes as shown in the left side polarity diagram in FIG. 2, the RE(−) and IM(−) curves generated from the polarities as illustrated with opposite polarities applied to vertically corresponding IDT electrodes as shown in the right side polarity diagram in FIG. 2.

It has been discovered that shifting the positions of the IDT electrodes 20 on the upper and lower surfaces of the piezoelectric layer 15 relative to one another and applying an electrical AC signal with 90 degree shifted phase relative to one another, may cause the Lamb wave resonator to exhibit an excitation mode characterized by piston mode acoustic waves (a third harmonic), similar to an excitation mode that might be observed for a film bulk acoustic wave resonator. Piston mode acoustic waves are characterized by waves that travel from the upper to the lower surface of the piezoelectric layer 15 and back, rather that in a direction parallel to the upper and lower surfaces. The piston mode may in some instances be preferable to any of the A0, F0, and/or F1 acoustic wave excitation modes due to a higher associated quality factor (Q) and a piezoelectric coupling coefficient K2 that is at least as good or superior to that associated with the A0, F0, and/or F1 acoustic wave excitation modes.

Figure 3:
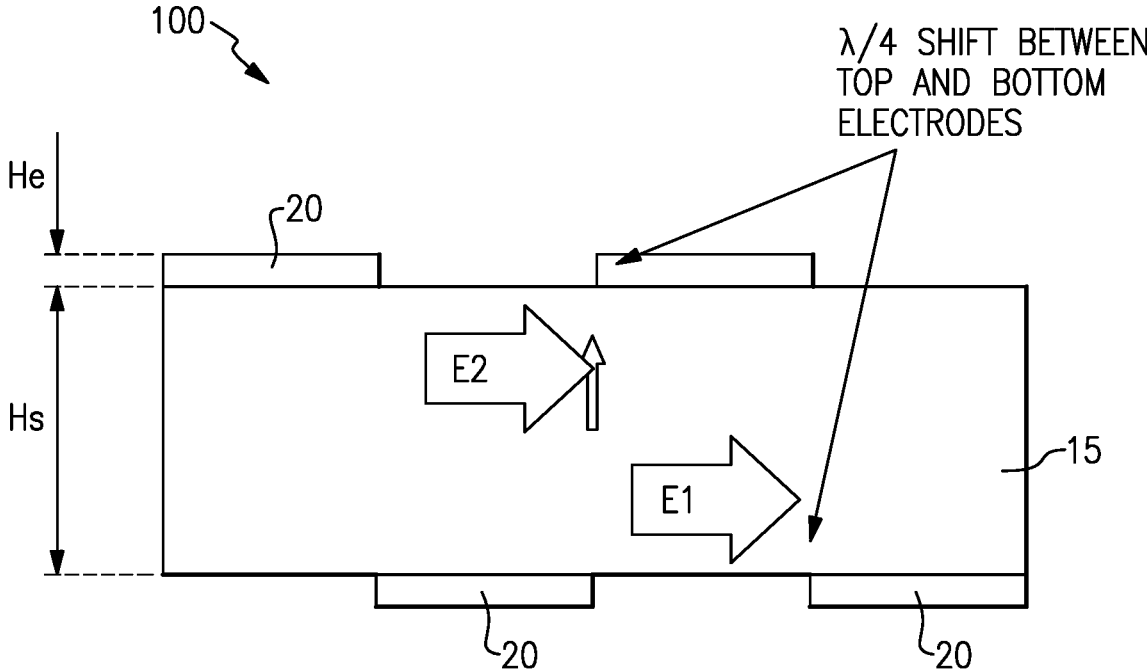
FIG. 3 is a simplified cross-sectional view of a portion of an example of a Lamb wave surface acoustic wave resonator capable of generating a piston mode acoustic waves.

FIG. 3 illustrates a partial cross-sectional view of a Lamb wave resonator 100 modified to generate a piston mode acoustic wave excitation mode. As illustrated, the positions of the IDT electrodes 20 on the upper and lower surfaces of the piezoelectric layer 15 are shifted by $\lambda/4$ relative to one another. In FIG. 3, the E2 and E1 arrows characterize the preferable electric field direction when the piston mode is exited. The relative shifting (shift of $\lambda/4$) of the upper and lower IDT electrodes provides for forming a homogeneous acoustic impedance type waveguide, where the upper and lower periodical surface acoustic impedances have an opposite distribution. In the illustrated device the piezoelectric layer 15 may be formed of AlN, although other piezoelectric materials may alternatively be used. The piezoelectric layer 15 may have a thickness $H_s$ ranging from $0.1\lambda$ to $1.0\lambda$ and IDT electrodes formed of Al or any other suitable metal, metal alloy, or metal stack and having a thickness $H_e$ ranging from $0.01\lambda$ to $0.3\lambda$. These dimensions are to be understood as only examples and may vary in different implementations according to design goals.

Figure 4:
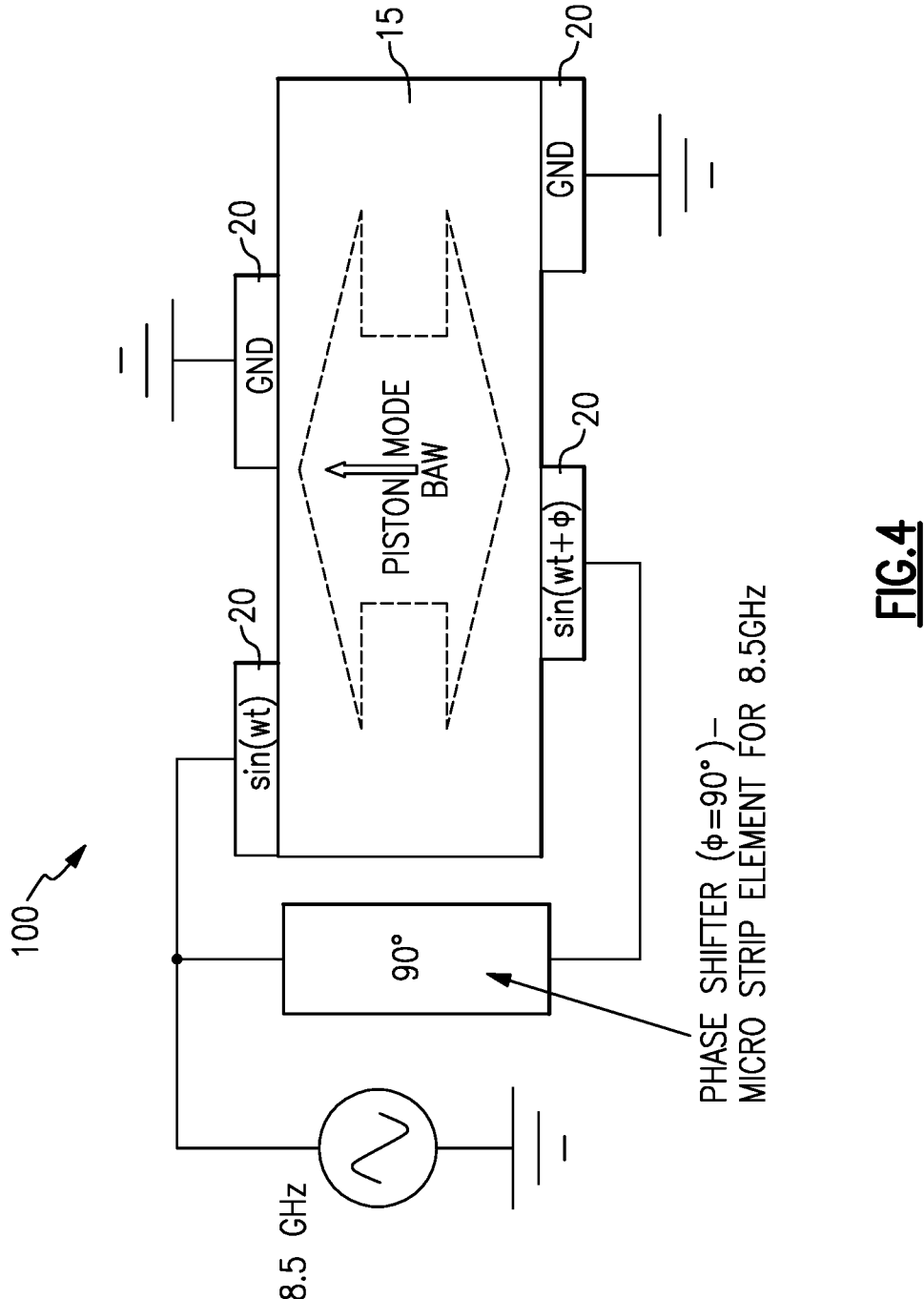
FIG. 4 illustrates a method of excitation of the piston mode acoustic waves in the acoustic wave resonator of FIG. 3.

The piston mode acoustic wave excitation mode may be generated by applying alternating current to the IDT electrodes 20 as illustrated in FIG. 4. A high frequency alternating current, for example, at 8.5 GHz as illustrated in FIG. 4 is applied to a first IDT electrode 20 on the upper surface of the piezoelectric film 15 and to a first IDT electrode 20 on the lower surface of the piezoelectric film 15. The phase of the voltage applied to the first IDT electrode 20 on the upper surface of the piezoelectric film 15 is phase shifted by 90° relative to the voltage applied to the first IDT electrode 20 on the lower surface of the piezoelectric film 15. IDT electrodes 20 adjacent to the first IDT electrode 20 on the upper surface of the piezoelectric film 15 and adjacent to the first IDT electrode 20 on the lower surface of the piezoelectric film 15 may be grounded, or in some instances, left floating, or held at a negative voltage. It should be understood that FIG. 4 only illustrates four IDT electrodes 20. In practice, acoustic wave devices as disclosed herein may include a far greater number of IDT electrodes 20. In such implementations, adjacently alternating IDT electrodes would have voltage applied and be grounded or left floating, respectively. In some implementations, the phase shift in voltage applied to the excited IDT electrodes 20 on the upper surface of the piezoelectric film 15 and the excited IDT electrodes 20 on the lower surface of the piezoelectric film 15 may be other than 90°, for example, any phase shift greater than zero degrees and up to 90° and the acoustic wave resonator 100 may still generate piston mode acoustic waves.

Figure 5:
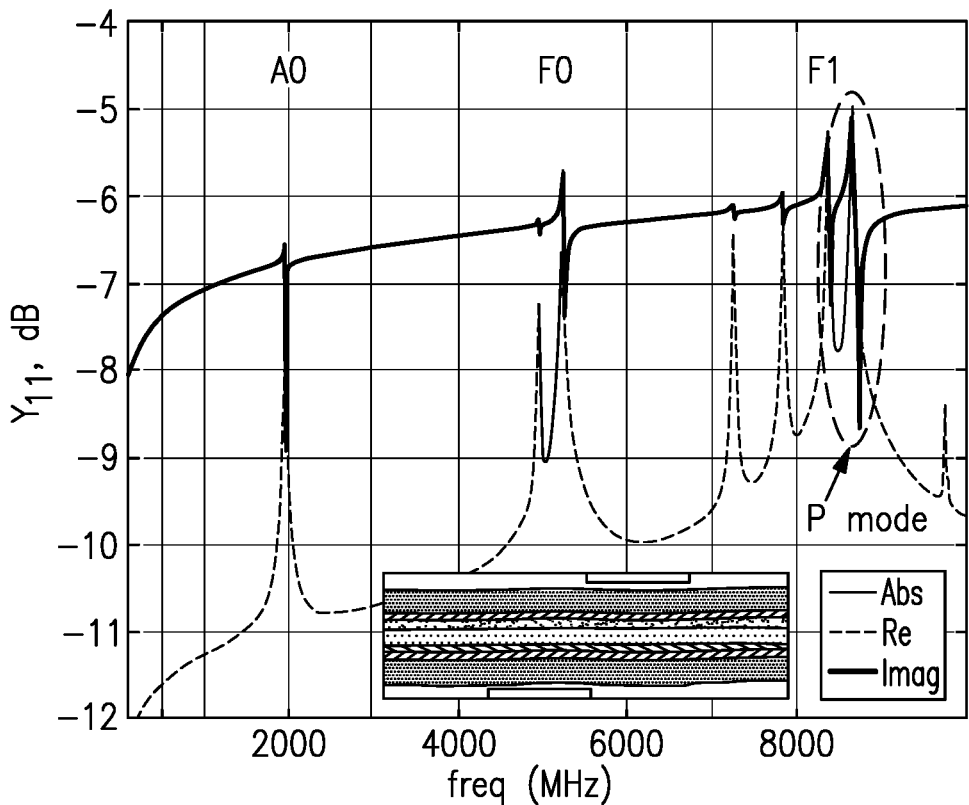
FIG. 5 illustrates a frequency at which the piston mode as well as other excitation modes occur in the acoustic wave resonator of FIG. 3.

A frequency at which the piston mode excitation mode is observed as compared to the A0, F0, and F1 modes in a resonator similar to that illustrated in FIGS. 3 and 4 in which $\lambda=2$ μm, $H_s=0.3\lambda$, and $H_e=0.03\lambda$ is illustrated in FIG. 5.

Figure 6A:
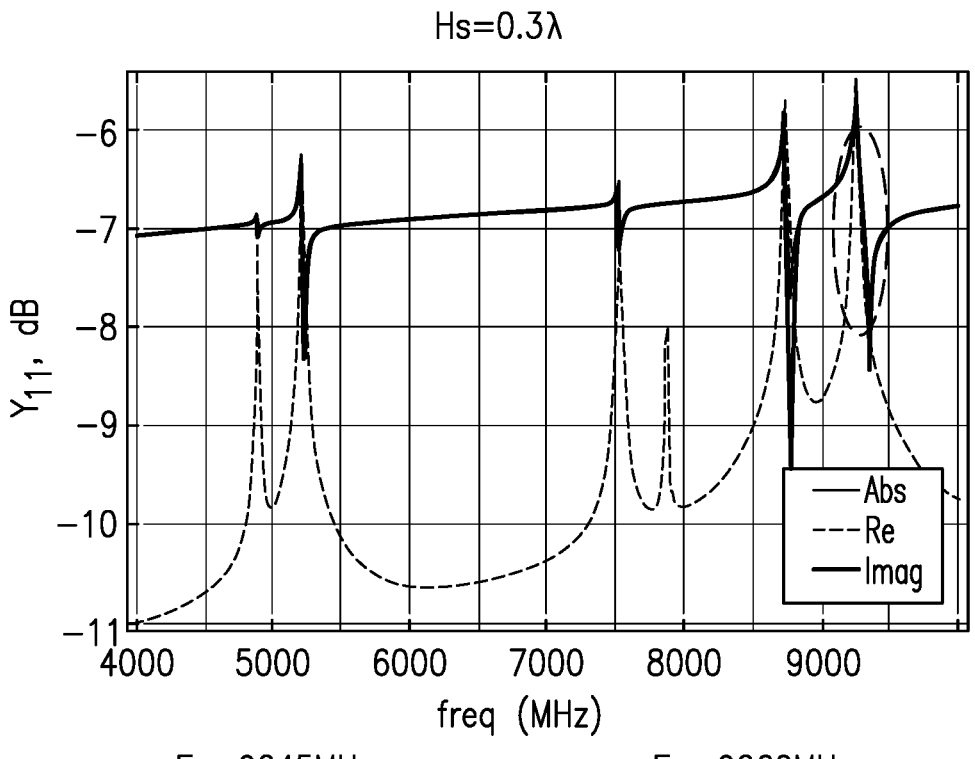
FIGS. 6A-6C illustrate frequencies at which the piston mode acoustic waves occur in an acoustic wave resonator as illustrated in FIG. 3 as a function of piezoelectric film thickness.
Figure 6B:
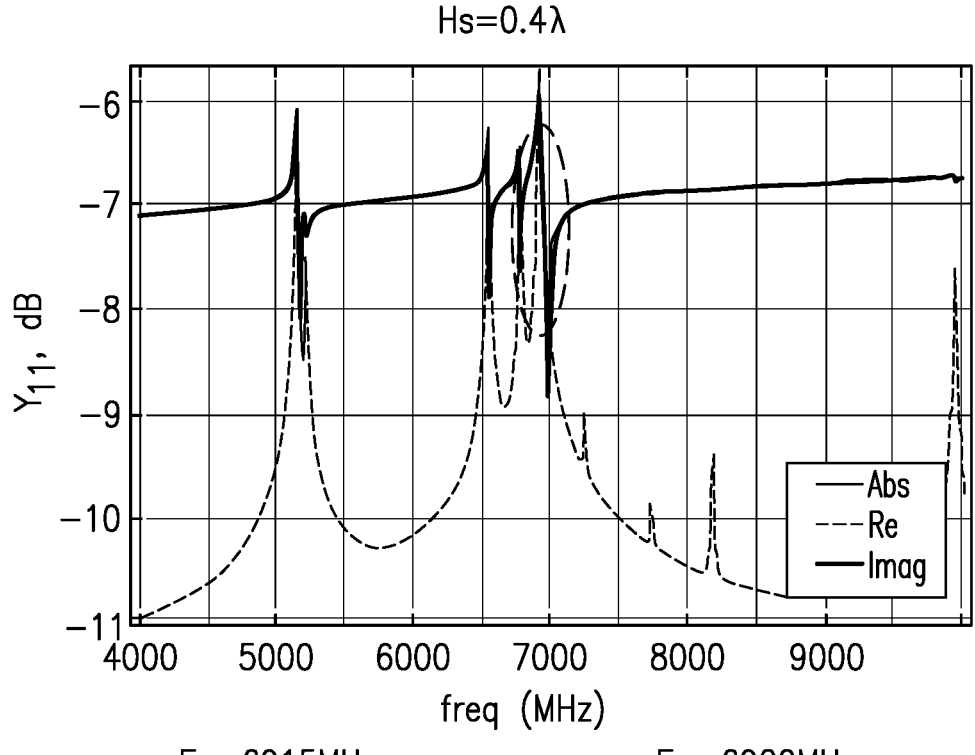
Figure 6C:
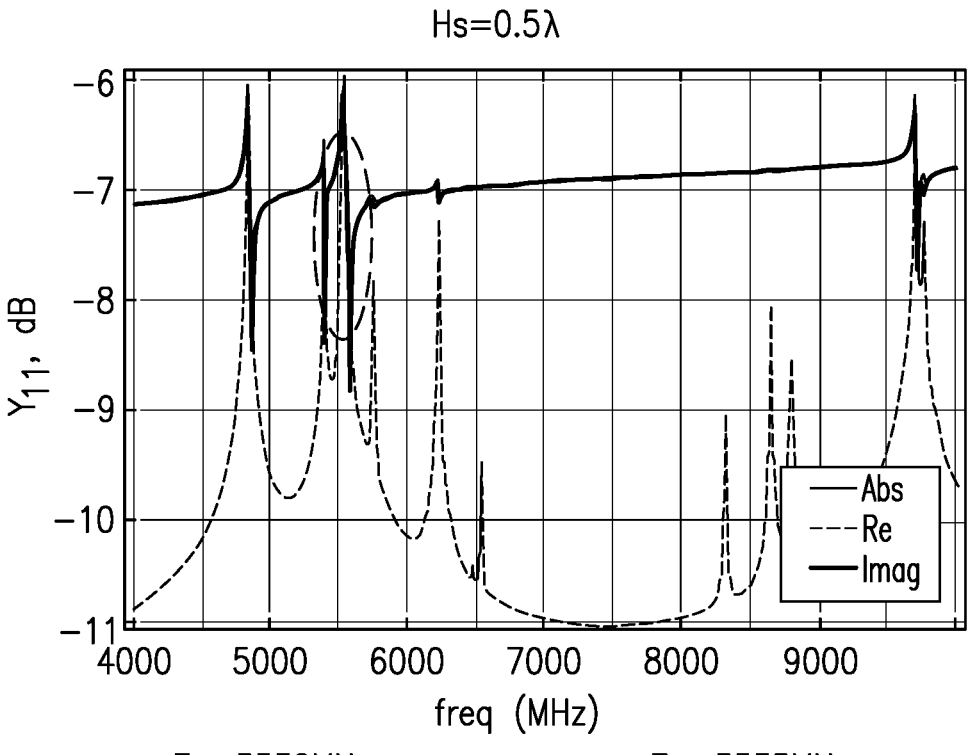

The frequency at which the piston mode excitation mode is observed depends on the thickness of the piezoelectric film. Simulations were performed on a resonator similar to that illustrated in FIGS. 3 and 4 in which $\lambda=2$ μm, He=0.03$\lambda$, and $H_s$ was varied from 0.3$\lambda$ to 0.5$\lambda$. The results of these simulations are shown in FIGS. 6A-6C. As can be observed, as the piezoelectric film thickness increased the piston mode resonance frequency (Fs) decreased from 9,254 MHz (for $H_s=0.3\lambda$) to 5,530 MHz (for $H_s=0.5\lambda$). The piston mode anti-resonance frequency (Fp) decreased from 9,260 MHz (for $H_s=0.3\lambda$) to 5,535 MHz (for $H_s=0.5\lambda$). The coupling coefficient K2 decreased from 0.4% (for $H_s=0.3\lambda$) to 0.2% (for $H_s=0.4\lambda$ or 0.3$\lambda$).

Figure 7:
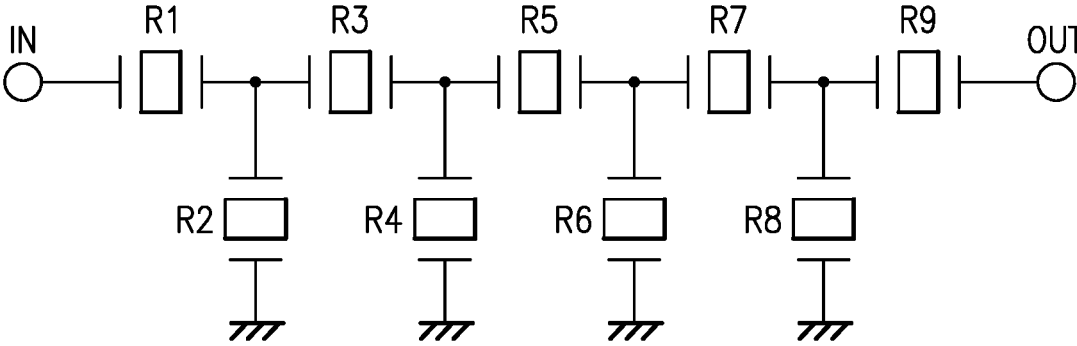
FIG. 7 is a schematic diagram of a radio frequency ladder filter.

In some embodiments, multiple resonators as disclosed herein may be combined into a filter, for example, an RF ladder filter schematically illustrated in FIG. 7 and including a plurality of series resonators R1, R3, R5, R7, and R9, and a plurality of parallel (or shunt) resonators R2, R4, R6, and R8. As shown, the plurality of series resonators R1, R3, R5, R7, and R9 are connected in series between the input and the output of the RF ladder filter, and the plurality of parallel resonators R2, R4, R6, and R8 are respectively connected between series resonators and ground in a shunt configuration. Other filter structures and other circuit structures known in the art that may include acoustic wave devices or resonators as disclosed herein, for example, duplexers, baluns, etc., may also be formed including examples of acoustic wave devices or resonators as disclosed herein.

Figure 8:
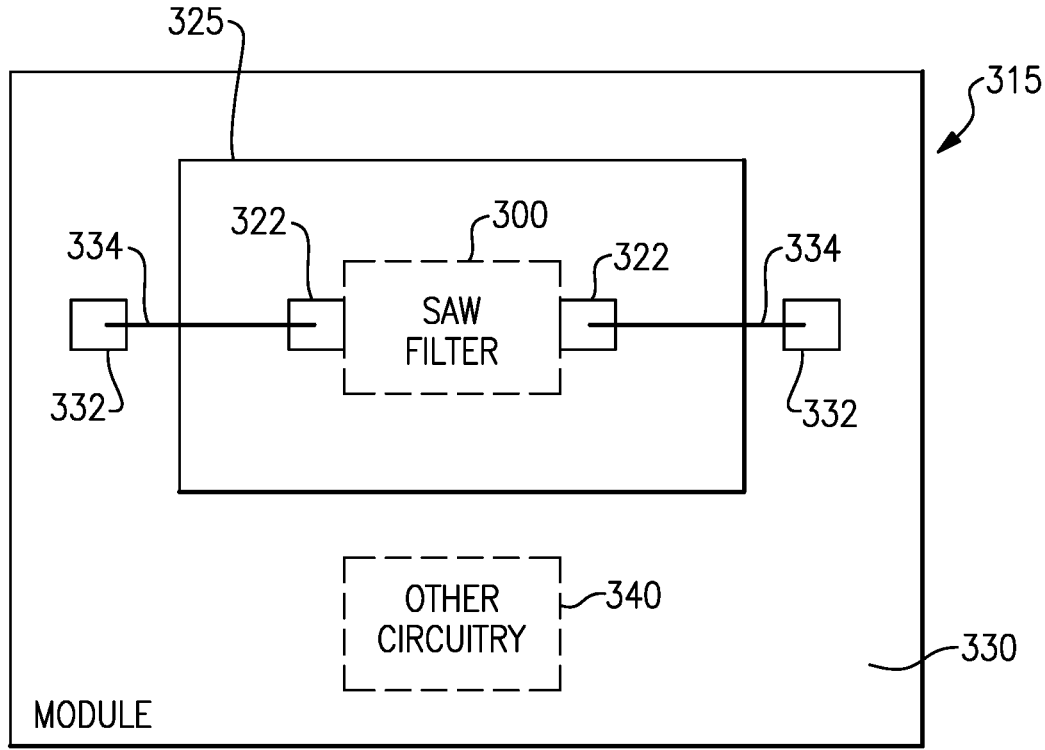
FIG. 8 is a block diagram of one example of a filter module that can include one or more acoustic wave elements according to aspects of the present disclosure.
Figure 9:
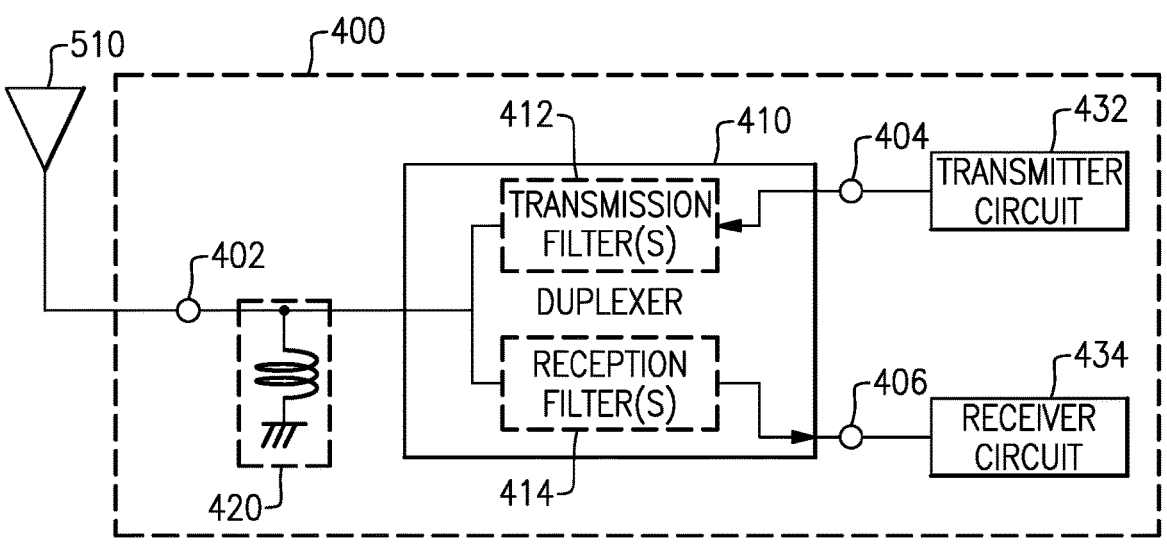
FIG. 9 is a block diagram of one example of a front-end module that can include one or more filter modules according to aspects of the present disclosure.
Figure 10:
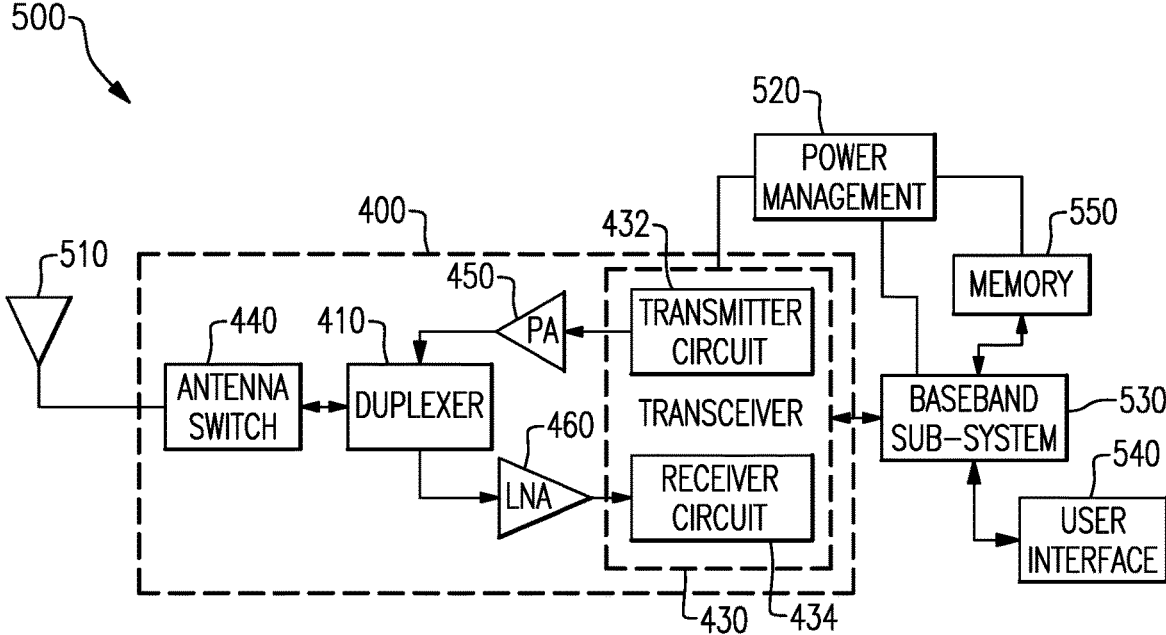
FIG. 10 is a block diagram of one example of a wireless device including the front-end module of FIG. 9.

Examples of acoustic wave devices or discussed herein can be implemented in a variety of packaged modules. Some example packaged modules will now be discussed in which any suitable principles and advantages of the acoustic wave devices or discussed herein can be implemented. FIGS. 8, 9, and 10 are schematic block diagrams of illustrative packaged modules and devices according to certain embodiments.

As discussed above, surface acoustic wave resonators can be used in acoustic wave RF filters. In turn, an RF filter using one or more acoustic wave elements may be incorporated into and packaged as a module that may ultimately be used in an electronic device, such as a wireless communications device, for example. FIG. 8 is a block diagram illustrating one example of a module 315 including an acoustic wave element filter 300. The acoustic wave element filter 300 may be implemented on one or more die(s) 325 including one or more connection pads 322. For example, the acoustic wave element filter 300 may include a connection pad 322 that corresponds to an input contact for the acoustic wave element filter and another connection pad 322 that corresponds to an output contact for the acoustic wave element filter. The packaged module 315 includes a packaging substrate 330 that is configured to receive a plurality of components, including the die 325. A plurality of connection pads 332 can be disposed on the packaging substrate 330, and the various connection pads 322 of the acoustic wave element filter die 325 can be connected to the connection pads 332 on the packaging substrate 330 via electrical connectors 334, which can be solder bumps or wirebonds, for example, to allow for passing of various signals to and from the acoustic wave element filter 300. The module 315 may optionally further include other circuitry die 340, for example, one or more additional filter(s), amplifiers, pre-filters, modulators, demodulators, down converters, and the like, as would be known to one of skill in the art of semiconductor fabrication in view of the disclosure herein. In some embodiments, the module 315 can also include one or more packaging structures to, for example, provide protection and facilitate easier handling of the module 315. Such a packaging structure can include an overmold formed over the packaging substrate 330 and dimensioned to substantially encapsulate the various circuits and components thereon.

Various examples and embodiments of the acoustic wave element filter 300 can be used in a wide variety of electronic devices. For example, the acoustic wave element filter 300 can be used in an antenna duplexer, which itself can be incorporated into a variety of electronic devices, such as RF front-end modules and communication devices.

Referring to FIG. 9, there is illustrated a block diagram of one example of a front-end module 400, which may be used in an electronic device such as a wireless communications device (e.g., a mobile phone) for example. The front-end module 400 includes an antenna duplexer 410 having a common node 402, an input node 404, and an output node 406. An antenna 510 is connected to the common node 402.

The antenna duplexer 410 may include one or more transmission filters 412 connected between the input node 404 and the common node 402, and one or more reception filters 414 connected between the common node 402 and the output node 406. The passband(s) of the transmission filter(s) are different from the passband(s) of the reception filters. Examples of the acoustic wave element filter 300 can be used to form the transmission filter(s) 412 and/or the reception filter(s) 414. An inductor or other matching component 420 may be connected at the common node 402.

The front-end module 400 further includes a transmitter circuit 432 connected to the input node 404 of the duplexer 410 and a receiver circuit 434 connected to the output node 406 of the duplexer 410. The transmitter circuit 432 can generate signals for transmission via the antenna 510, and the receiver circuit 434 can receive and process signals received via the antenna 510. In some embodiments, the receiver and transmitter circuits are implemented as separate components, as shown in FIG. 9, however, in other embodiments these components may be integrated into a common transceiver circuit or module. As will be appreciated by those skilled in the art, the front-end module 400 may include other components that are not illustrated in FIG. 9 including, but not limited to, switches, electromagnetic couplers, amplifiers, processors, and the like.

FIG. 10 is a block diagram of one example of a wireless device 500 including the antenna duplexer 410 shown in FIG. 9. The wireless device 500 can be a cellular phone, smart phone, tablet, modem, communication network or any other portable or non-portable device configured for voice or data communication. The wireless device 500 can receive and transmit signals from the antenna 510. The wireless device includes an embodiment of a front-end module 400 similar to that discussed above with reference to FIG. 9. The front-end module 400 includes the duplexer 410, as discussed above. In the example shown in FIG. 10 the front-end module 400 further includes an antenna switch 440, which can be configured to switch between different frequency bands or modes, such as transmit and receive modes, for example. In the example illustrated in FIG. 10, the antenna switch 440 is positioned between the duplexer 410 and the antenna 510; however, in other examples the duplexer 410 can be positioned between the antenna switch 440 and the antenna 510. In other examples the antenna switch 440 and the duplexer 410 can be integrated into a single component.

The front-end module 400 includes a transceiver 430 that is configured to generate signals for transmission or to process received signals. The transceiver 430 can include the transmitter circuit 432, which can be connected to the input node 404 of the duplexer 410, and the receiver circuit 434, which can be connected to the output node 406 of the duplexer 410, as shown in the example of FIG. 10.

Signals generated for transmission by the transmitter circuit 432 are received by a power amplifier (PA) module 450, which amplifies the generated signals from the transceiver 430. The power amplifier module 450 can include one or more power amplifiers. The power amplifier module 450 can be used to amplify a wide variety of RF or other frequency-band transmission signals. For example, the power amplifier module 450 can receive an enable signal that can be used to pulse the output of the power amplifier to aid in transmitting a wireless local area network (WLAN) signal or any other suitable pulsed signal. The power amplifier module 450 can be configured to amplify any of a variety of types of signal, including, for example, a Global System for Mobile (GSM) signal, a code division multiple access (CDMA) signal, a W-CDMA signal, a Long-Term Evolution (LTE) signal, or an EDGE signal. In certain embodiments, the power amplifier module 450 and associated components including switches and the like can be fabricated on gallium arsenide (GaAs) substrates using, for example, high-electron mobility transistors (pHEMT) or insulated-gate bipolar transistors (BiFET), or on a Silicon substrate using complementary metal-oxide semiconductor (CMOS) field effect transistors.

Still referring to FIG. 10, the front-end module 400 may further include a low noise amplifier module 460, which amplifies received signals from the antenna 510 and provides the amplified signals to the receiver circuit 434 of the transceiver 430.

The wireless device 500 of FIG. 10 further includes a power management sub-system 520 that is connected to the transceiver 430 and manages the power for the operation of the wireless device 500. The power management system 520 can also control the operation of a baseband sub-system 530 and various other components of the wireless device 500. The power management system 520 can include, or can be connected to, a battery (not shown) that supplies power for the various components of the wireless device 500. The power management system 520 can further include one or more processors or controllers that can control the transmission of signals, for example. In one embodiment, the baseband sub-system 530 is connected to a user interface 540 to facilitate various input and output of voice and/or data provided to and received from the user. The baseband sub-system 530 can also be connected to memory 550 that is configured to store data and/or instructions to facilitate the operation of the wireless device, and/or to provide storage of information for the user. Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a range from about 30 kHz to 10 GHz, such as in the X or Ku 5G frequency bands.

Aspects of this disclosure can be implemented in various electronic devices. Examples of the electronic devices can include, but are not limited to, consumer electronic products, parts of the consumer electronic products such as packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a stereo system, a digital music player, a radio, a camera such as a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. An acoustic wave resonator comprising a plurality of interdigital transducer (IDT) electrodes disposed on upper and lower sides of a piezoelectric film, the IDT electrodes on the upper side of the piezoelectric film being offset from the IDT electrodes on the lower side of the piezoelectric film by $\lambda/4$, $\lambda$ being a wavelength of a main acoustic wave generated by the acoustic wave resonator to enable the acoustic wave resonator to generate piston mode acoustic waves responsive to electrical excitation of the plurality of IDT electrodes with an alternating current, the plurality of IDT electrodes being electrically coupled to a frequency generator and phase shifter that causes a phase of an excitation voltage applied to the IDT electrodes on the upper side of the piezoelectric film to be phase shifted from an excitation voltage applied to the IDT electrodes on the lower side of the piezoelectric film by greater than zero degrees and up to 90°.

2. The acoustic wave resonator of claim 1 wherein the piezoelectric film includes aluminum nitride.

3. The acoustic wave resonator of claim 2 wherein the piezoelectric film has a thickness of between $0.1\lambda$ and $1.0\lambda$.

4. The acoustic wave resonator of claim 2 wherein the piezoelectric film has a thickness of between $0.3\lambda$ and $0.5\lambda$.

5. The acoustic wave resonator of claim 1 wherein the plurality of IDT electrodes each have a thickness of between about $0.01\lambda$ and about $0.03\lambda$.

6. The acoustic wave resonator of claim 1 included in an electrical module having the frequency generator and phase shifter that causes the phase of the excitation voltage applied to the IDT electrodes on the upper side of the piezoelectric film to be phase shifted from the excitation voltage applied to the IDT electrodes on the lower side of the piezoelectric film.

7. The acoustic wave resonator of claim 1 included in an electrical module having the frequency generator and phase shifter that causes the phase of the excitation voltage applied to the IDT electrodes on the upper side of the piezoelectric film to be phase shifted by 90° from the excitation voltage applied to the IDT electrodes on the lower side of the piezoelectric film.

8. The acoustic wave resonator of claim 1 having a resonant frequency above 5 GHz.

9. The acoustic wave resonator of claim 8 having a resonant frequency above 6.5 GHz.

10. The acoustic wave resonator of claim 8 having a resonant frequency above one of 9 GHz or 9.2 GHz.

* * * * *